(12) United States Patent
Barth et al.

(10) Patent No.: US 6,580,090 B2
(45) Date of Patent: Jun. 17, 2003

(54) ORGANIC LIGHT-EMITTING DEVICES

(75) Inventors: Siegfried Johannes Barth, Marburg (DE); Tilman A. Beierlein, Kilchberg (CH); Siegfried F. Karg, Adliswil (CH); Heike Riel, Rueschlikon (CH); Walter Heinrich Riess, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/887,639

(22) Filed: Jun. 22, 2001

(65) Prior Publication Data
US 2002/0197765 A1 Dec. 26, 2002

(51) Int. Cl.$^7$ .......................... H01L 35/24; H01L 51/00
(52) U.S. Cl. .......................... 257/40; 438/99
(58) Field of Search ........................ 257/40, 59; 438/99

(56) References Cited

U.S. PATENT DOCUMENTS

| | | | | |
|---|---|---|---|---|
| 5,559,400 A | * | 9/1996 | Nakayama et al. | 313/506 |
| 5,895,228 A | * | 4/1999 | Biebuyck et al. | 438/127 |
| 5,949,184 A | * | 9/1999 | Ohoshi et al. | 313/485 |
| 5,998,805 A | * | 12/1999 | Shi et al. | 257/103 |
| 6,080,030 A | * | 6/2000 | Isaka et al. | 445/24 |
| 6,294,398 B1 | * | 9/2001 | Kim et al. | 257/40 |
| 2001/0010884 A1 | * | 1/2001 | Guehler et al. | 430/7 |
| 2001/0050531 A1 | * | 2/2001 | Ikeda | 313/498 |
| 2001/0043046 A1 | * | 5/2001 | Fukunaga | 315/160 |

* cited by examiner

Primary Examiner—Ngan V. Ngo
Assistant Examiner—Thao X. Le
(74) Attorney, Agent, or Firm—Ohlandt, Greeley, Ruggiero & Perle, L.L.P.; Robert M. Trepp

(57) ABSTRACT

A method of making a light-emitting device comprises forming a first and second components. The first component has a first substrate, a first electrode on the first substrate, an organic layer on the first electrode, and a light-transmissive second electrode on the organic layer. The second component has a light-transmissive second substrate, and a light transmissive, electrically conductive layer on the second substrate. The first and second components are joined with the second electrode of the first component facing the conductive layer of the second component. An electrical contact is formed between the second electrode of the first component and the electrically conductive layer of the second component.

7 Claims, 4 Drawing Sheets ate and one or more organic layers disposed between the first electrode and a second electrode. Light output is generated by charge injection into the organic material via the electrodes. The organic material emits photons on excitation by the injected charge. At least one of the electrodes is typically formed from a light transmissive material such as Indium Tin Oxide (ITO) or a thin metal to permit passage of light out of the device. Light transmissive materials should be understood to include both transparent and semitransparent materials.

ORGANIC LIGHT-EMITTING DEVICES

FIELD OF INVENTION

The present invention relates to the organic light emitting devices for display applications and to methods for fabricating such devices.

BACKGROUND

Organic light-emitting devices (OLEDs) are typically manufactured as a sequence of layers deposited on top of each other to form a layer structure. The layer structure typically comprises a first electrode on a supporting substrate and one or more organic layers disposed between the first electrode and a second electrode. Light output is generated by charge injection into the organic material via the electrodes. The organic material emits photons on excitation by the injected charge. At least one of the electrodes is typically formed from a light transmissive material such as Indium Tin Oxide (ITO) or a thin metal to permit passage of light out of the device. Light transmissive materials should be understood to include both transparent and semitransparent materials.

If the supporting substrate has a relatively low transparency, then it is desirable for light output to flow through the second electrode. An example of a relatively low transparency supporting substrate material is c-Si. Similarly, it is desirable for light output to flow through the second electrode if the aperture ratio is adversely affected by dimensions of underlying driving circuitry, As demonstrated in U.S. Pat. No. 5,981,306 to Burrows et al. and U.S. Pat. No. 5,714,838 to Haight et al, this can be achieved via a thin semitransparent metallic layer or via a transparent conducting layer. To achieve sufficient transparency with a semitransparent metal, the layer thickness has to be very thin (typically <20 nm). This causes an increase in sheet resistance and a significant voltage drop across the layer, especially at large display sizes. Hence, the power efficiency and the uniformity of light emission is adversely affected. A problem associated with deposition of a transparent conductor such as ITO on the organic layers is that such deposition may cause damage to the underlying layers thereby diminishing device performance considerably. The amount of damage increases with increasing deposition rates. The deposition rate is preferably made sufficiently low to reduce such damage to a tolerable amount. However, this reduces processing speed.

U.S. Pat. No. 5,965,979 to Friend et al. describes a manufacturing technique comprising laminating together two self-supporting components each having a light-emitting organic layer on top. A problem associated with this method is that the lamination does not provide an intimate contact to the organic layers at a microscopic level over large areas. Such contact is desirable in the interests of reproducible fabrication of efficient and uniform light-emitting devices.

SUMMARY OF THE INVENTION

In accordance with the present invention, there is now provided a method of making a light-emitting device comprising: forming a first component having a first substrate, the forming of the first component comprising locating a first electrode on the first substrate, locating an organic layer on the first electrode, and locating a light-transmissive second electrode on the organic layer; forming a second component having a light-transmissive second substrate, the forming of the second component comprising locating a light transmissive, electrically conductive layer on the second substrate; joining the first component and the second component with the second electrode of the first component facing the conductive layer of the second component; and, forming, an electrical contact between the second electrode of the first component and the electrically conductive layer of the second component.

The method preferably comprises locating spacers between the first component and the second component. At least one of the spacers may be formed on the electrically conductive layer of the second component. Similarly, at least one of the spacers may be formed on the first substrate. The or each spacer formed on the first substrate may be coated with the organic layer. Similarly, the or each spacer formed on the first substrate may be coated with the second electrode. It will be appreciated that at least some of the spacers may be formed on the second electrode. Conductive paths between electrically conductive layer and the second electrode may be established via the spacers. The locating of the first electrode may comprise patterning the first electrode on the first substrate. In preferred embodiments of the present invention, the locating of the spacers between the first component and the second component comprises positioning the spacers at sites remote from areas of the substrate occupied by the first electrode. In particularly preferred embodiments of the present invention, the joining of the first component and the second component comprises forming a peripheral seal between the first component and the second component and creating a vacuum within the peripheral seal.

Viewing the present invention from another aspect, there is now provided a light-emitting device comprising: a first component having a first substrate, a first electrode on the first substrate, an organic layer on the first electrode, and a light-transmissive second electrode on the organic layer; a second component having a light-transmissive second substrate and a light transmissive, electrically conductive layer on the second substrate; means for joining the first component and the second component with the second electrode of the first component facing the conductive layer of the second component; and, an electrical contact for electrically connecting the second electrode of the first component and the conductive layer of the second component.

The spacers may be distributed between the first component and the second component. At least one of the spacers may be integral to the first component. The or each spacer of the first component may be disposed on the first substrate. The or each spacer of the first component may be coated with the organic layer. Similarly, the or each spacer of the first component may be coated with the second electrode. Alternatively, the or each spacer of the first component is disposed on the second electrode. At least one of the spacers may be integral to the second component. In preferred embodiments of the present invention, the spacers are electrically conductive. The first component may comprise a plurality of organic layers disposed between the first electrode and the second electrode. The spacers are preferably located at sites remote from areas of the substrate occupied by the first electrode. The joining means preferably comprises a peripheral seal between the first component and the second component and a vacuum is disposed within the peripheral seal.

In a preferred embodiment of the present invention to be described shortly, there is provided an OLED for large area display applications and a method for making the same. The method is especially suitable for manufacture of such OLEDs on substrates which allow less than 80% transmission of the internally emitted light. The OLEDs described herein comprise two components. The first component has a substrate carrying an organic layer. A first electrode layer is disposed between the organic layer and substrate. A second electrode layer is disposed on the surface of the organic layer remote from the substrate. The second electrode layer comprises a thin semitransparent metal electrode layer (<20 nm) in intimate electrical contact with an underlying organic layer to provide uniform charge injection in the interests of optimizing display output. The metal layer can be formed from any metal or combination of metals. The second component carries a highly electrically conductive layer. The first and second components are superimposed on each other with the conductive layer of the second component is overlying and in electrical contact with the second electrode of the first component. The conductive layer of the second component avoids significant voltage drop across the second electrode of the first component. The electrical contact between the conductive coating of the second component and the second electrode of the first component need not be in intimate electrical contact. Spacers are preferably provided to reduce the risk of mechanical damage when the first and second components of the OLED are brought together. Additionally, the spacers improve the mechanical stability of the OLED.

The conductive layer on the second component may be regarded as a part of the second electrode. And advantage of providing the second electrode in multiple parts is that each part can be optimized seperatly in terms of; for example, transparency, conductivity, low damage, injection efficiency, processing speed. Another advantage is that the conductive contact between the parts does not have to be intimate over the entire display area. This is an improvement over conventional techniques, such as that described in the aforementioned Friend et al. reference, in which the lamination of two organic compounds described therein clearly demands an intimate conductive contact. In embodiments of the present invention, the lateral conductivity of the parts is sufficient to bridge a distance of several micrometers between periodic contacts. Embodiments of the present inventions are therefore much more tolerant to mechanical strain.

In another preferred embodiment of the present invention to be described shortly, there is provided a light-emitting device comprising: a substrate having a plurality vias formed therein; a first electrode on the substrate, an organic layer on the first electrode; a light-transmissive second electrode on the organic layer; and an electrically conductive layer communicating with second electrode through the vias. The conductive layer may be embedded in the substrate. Alternatively, the conductive may be disposed on the side of the substrate remote from the first electrode.

BRIEF DESCRIPTION OF THE DRAWINGS

Preferred embodiments of the present invention will now be described, by way of example only, with reference to the accompanying drawings, in which.

DETAILED DESCRIPTION OF A EMBODIMENT

Figure 1:
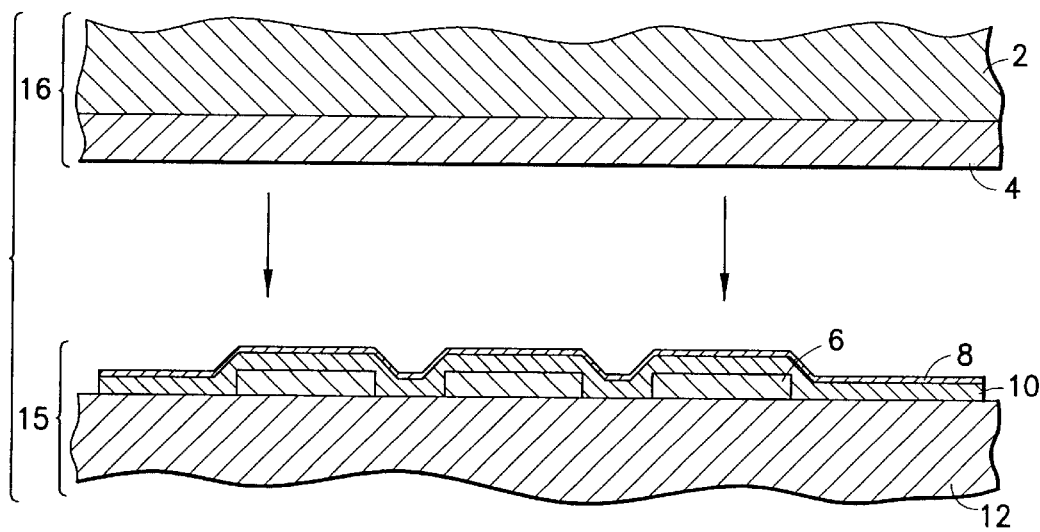
FIG. 1 is a cross-sectional exploded view of an example of an OLED embodying the present invention.

Referring first to FIG. 1, an example of an OLED embodying the present invention comprises a first substrate 12 and a second substrate 2. The first substrate 12 may be formed from a light transmissive material such as glass or plastics or from an opaque material such as a Silicon wafer. The first substrate 12 may also comprise additional electrical circuitry such as an active matrix thin film transistor (TFT) driver array.

An electrically conductive layer 6 is disposed on the first substrate 12. The conductive layer 6 may be formed from opaque materials or light transmissive materials. More specifically, the conductive layer 6 may be formed from a range of different materials including, without limitation, organic conductors such as polyaniline, polythiophene and derivatives thereof; and Indium Tin Oxide and light transmissive metals, for example. The conductive layer 6 may be partitioned into electrically addressable portions to facilitate the generation of a displayed image from the OLED in response to, for example, an input video signal. In operation, the conductive layer 6 acts as a first electrode.

An organic layer 10 is disposed on the first electrode 6. The organic layer 10 may comprise a stack of layers of materials with at least one layer of the stack comprising an organic material.

Other layers in the stack may be inorganic. For example, charge injection layers may be included in the stack adjacent the organic material therein. The organic layer 10 comprises active components which are emissive of light when electrically stimulated. These active components may be organic molecules or organic polymers such as a poly(phenylene vinylene).

An electrically conductive layer 8 is disposed on the conductive layer 6. The conductive layer 8 comprises a light transmissive material. More specifically, the conductive layer 8 may be formed from a range of different materials including, but not limited to, organic conductors such as polyaniline, polythiophene and derivatives thereof; and Indium Tin Oxide and light transmissive metals, for example. In operation, the conductive layer 8 acts as a second electrode of the OLED and permits coupling of emitted light out of the OLED. The conductive layer 8 may be also partitioned into electrically addressable portions to facilitate the generation of a displayed image from the OLED as mentioned hereinbefore with reference to the conductive layer 6.

The second substrate 2 is formed from a light transmissive material such as plastics or glass. An electrically conductive layer 4 is disposed on the second substrate 2. The conductive layer 4 comprises an electrically conductive, light transmissive material such as Indium Tin Oxide. Alternatively or additionally, the conductive layer 4 may comprise a metal grid disposed on the second substrate 2. The first substrate 12, together with the layers 6–10 disposed thereon collectively form a first self-supporting component 15. Likewise, the second substrate 2 and the layers 4 thereon collectively form a second self-supporting component 16.

During manufacture, the first component 15 and the second component 16 are joined together into a composite structure with the layer 4 on the second substrate facing the layer 8 on the first substrate 12 thereby forming an electrical contact between the layer 4 and the layer 8. The emissive area of the OLED is limited only by the pattern of the first electrode.

Figure 2:
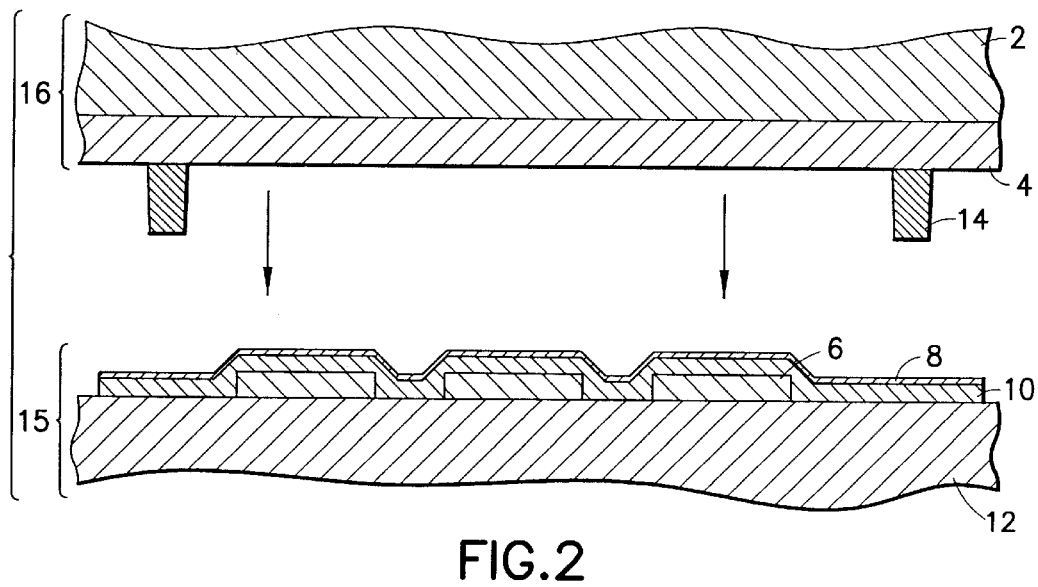
FIG. 2 is a cross-sectional exploded view of another example of an OLED embodying the present invention.

Turning to FIG. 2, in a modification to the OLED device hereinbefore described with reference to FIG. 1, electrically conductive spacers 14 are disposed on the surface of the conductive layer 4. During manufacture, the second substrate 2 is brought together with the first substrate 12. The spacers 14 thus make electrical contact with the conductive layer 8. The conductive layer 4 is thus electrically connected to the conductive layer 8 via the spacers 14. The first and second components are however maintained at a distance from each other by the intervening spacers 14. The spacers may be formed from metal or a light transmissive electrical conductor. Electrical contact between the conductive layer 8 carried by the first substrate 12 and the conductive layer 4 is made via the spacers 14 in regions which are devoid of the conductive layer 6. This minimizes the probability of mechanical damage to the OLED with negligible reduction in the total emissive area of the OLED.

Figure 3:
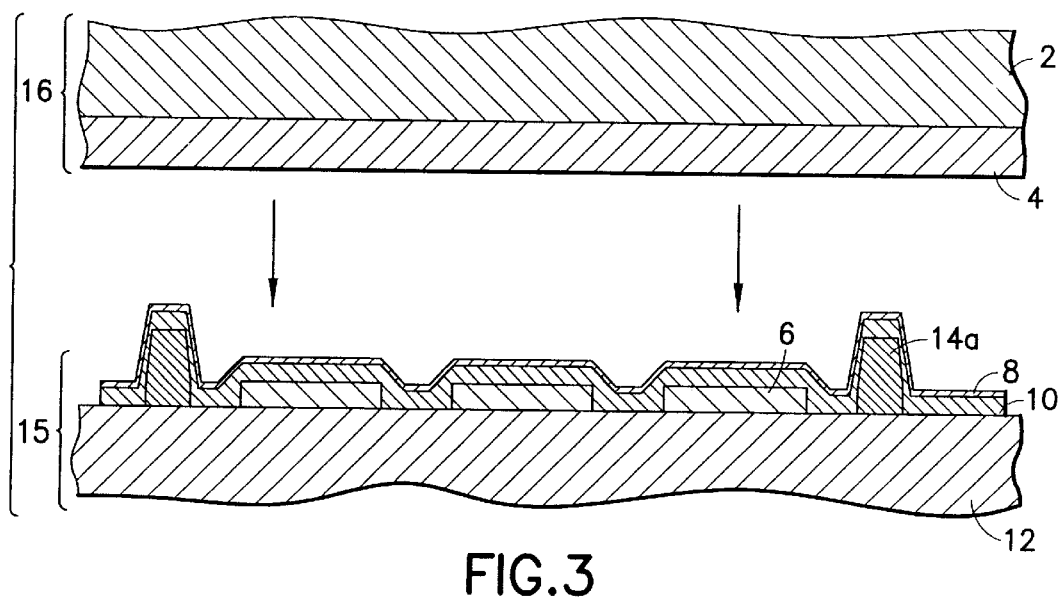
FIG. 3 is a cross-sectional exploded view of yet another example of an OLED embodying the present invention.

Referring to FIG. 3, in a modification of the OLED device hereinbefore described with reference to FIG. 2, the spacers 14a are disposed on the first substrate 12 beneath the conductive layer 8 and the organic layer 10 in regions devoid of the conductive layer 6. In this arrangement, the spacers need not be electrical conductive. However, electrically conductive spacers may be nevertheless employed. During manufacture, the spacers 14a are formed on the first substrate 12 prior to deposition of the organic layer 10 and the conductive layer 8. This arrangement has a reduced requirement for horizontal alignment accuracy when laminating the first component 15 and the second component 16 together to form electrical contact between the conductive layer 4 and the conductive layer 8 because the spacers 14a form part of the first component 15.

Figure 4:
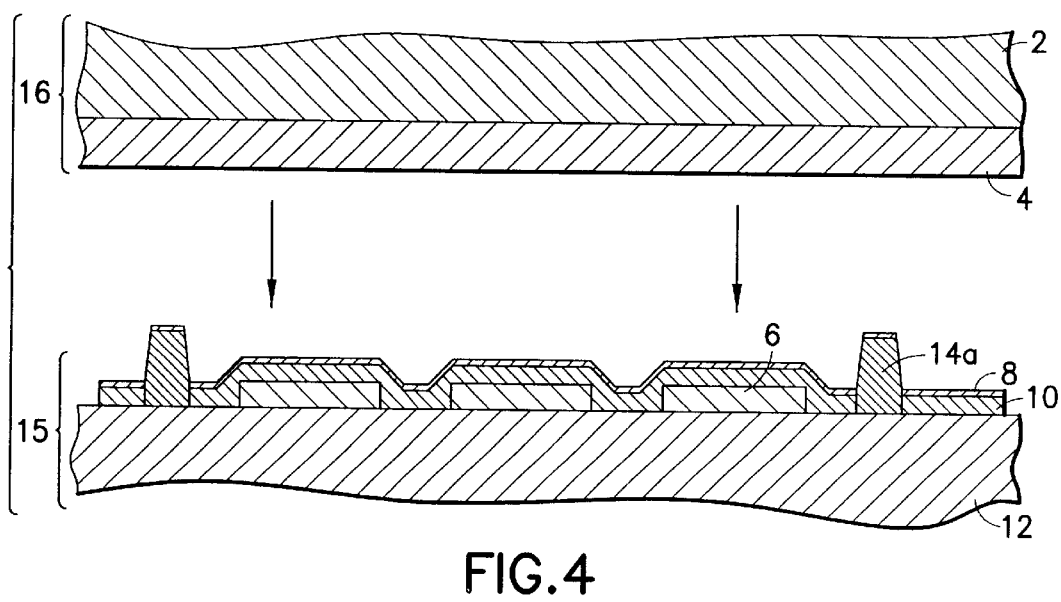
FIG. 4 is a cross-sectional exploded view of a further example of an OLED embodying the present invention.

With reference to FIG. 4, in a modification of the OLED device hereinbefore described with reference to FIG. 3, the spacers 14a are disposed on the first substrate 12 beneath the conductive layer 8. However, the organic layer 10 is now patterned onto the first substrate such that the spacers 14a are no longer coated with organic materials.

Figure 5:
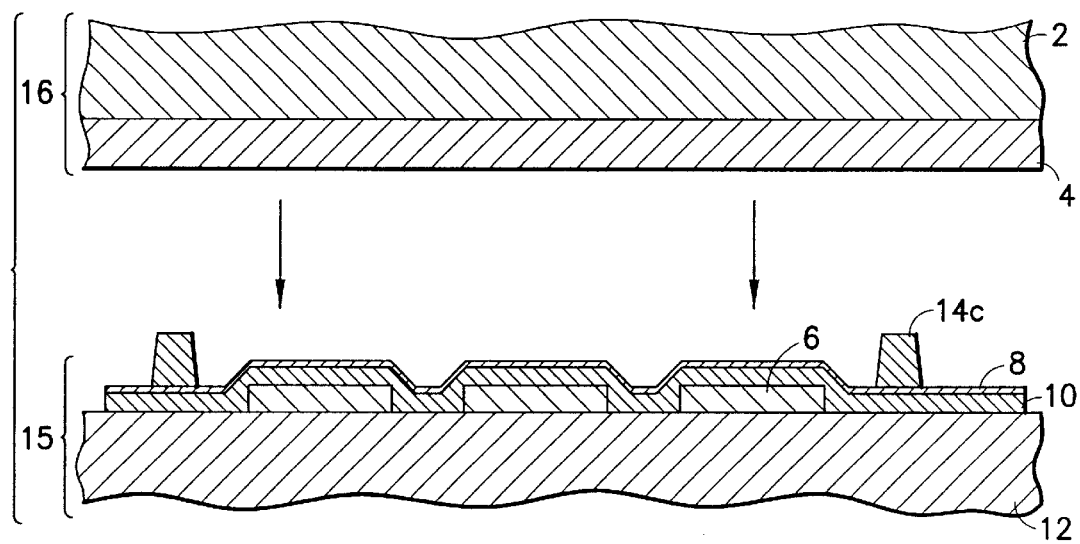
FIG. 5 is a cross-sectional exploded view of still another example of an OLED embodying the present invention.

Referring now to FIG. 5, in another modification of the OLED device hereinbefore described with reference to FIG. 3, the spacers 14c are formed after deposition of the organic layer 10 and the conductive layer 8. The spacers are thus disposed on the conductive layer 8.

Figure 6:
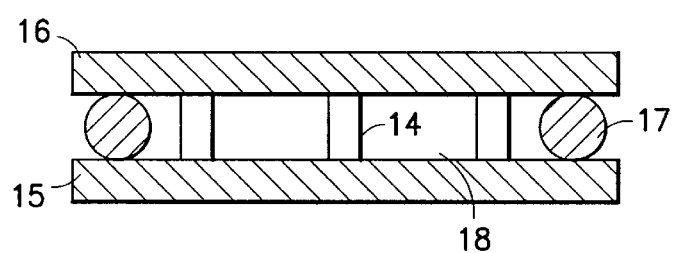
FIG. 6 is another cross-sectional view of an OLED embodying the present invention.

It will be appreciated that many methods and configurations for joining the first component 15 and the second component 16 together are possible. For example, referring to FIG. 6, in a particularly preferred embodiment of the present invention the first component 15 and the second component 16 are secured together by introducing a peripheral seal extending around the edges of the first component 15 and the second component. The seal 17, the first component 15, and the second component thus define an interior space 18. The interior space is then evacuated thereby urging the first component 15 and the second component 16 together.

It will also be appreciated that many methods and configurations for aligning the first component 15 relative to the second component 16 are possible. For example, locating lugs or similar formations may be provided on the component receiving the spacers 14 for keying with the spacer to align the first component 15 and the second component 16 during assembly of the OLED.

Similarly, it will be appreciated that the spacers 14 may be distributed between the first component 15 and the second component 16. For example, the spacers 14 may be alternately located on the first component 15 and the second component 16.

In summary, methods for making light-emitting devices have been hereinbefore described. The methods described are especially applicable to the manufacture of relatively large area display panels. The methods described involve the coupling of two self-supporting components 15 and 16. The first components 15 comprises a substrate 12 carrying an organic layer 10 disposed between first and second electrically conductive electrode layers 6 and 8. In operation, the electrode layers facilitate charge injection into the organic layer. The injected charge stimulates light emissions from the organic layer. The electrode layer 8 remote from the substrate 12 is light transmissive to permit output of light from the OLED. The second component 16 comprises a second substrate 16 carrying a light transmissive electrical conductive layer or grid 4, Contact is established between the electrode layer 8 on the first component 15 and the conductive layer 4 on the second component 16. The conductive layer 4 on the second component 16 provides additional current paths between the points of contact between the first component 15 and the second component 16 thereby avoiding significant voltage drop across the conductive layer 8.

Figure 7:
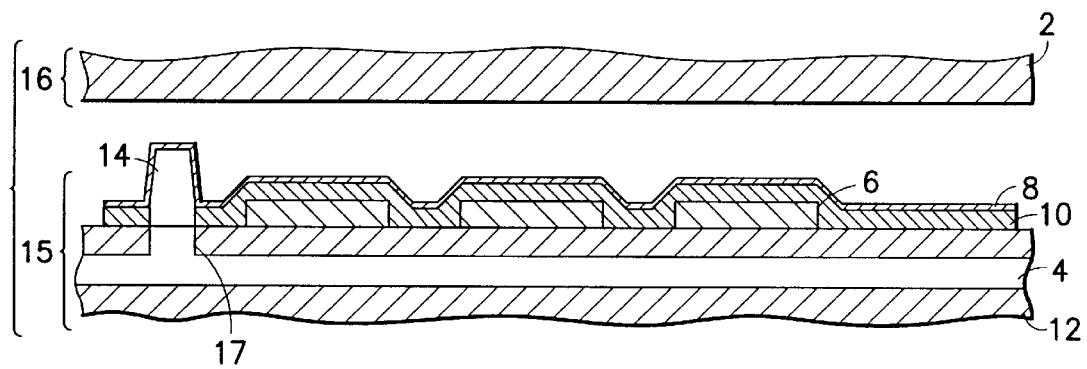
FIG. 7 is a cross-sectional exploded view of another example of an OLED embodying the present invention.

Referring now to FIG. 7, in a modification of the OLED device hereinbefore described with reference to FIG. 4, the conductive layer 4 is integrated into the first component 15 instead of the second component 16. Specifically, conductive layer 4 is embedded in the substrate 12. The spacers 14 are formed from an electrically conductive material. The conductive layer 4 communicates with the spacers 14 through vias 17 fonned in the substrate 12. The conductive layer 8 is in electrical contact with the spacers 14. The embedded conductive layer 4 provides additional current paths between the spacers 14 thereby again avoiding significant voltage drop across the conductive layer 8. In a modification to the embodiment hereinbefore described with reference to FIG. 7, the conductive layer 4 is located on the face of the substrate remote from the spacers 14 and the vias 17 extend through the substrate to permit electrical contact between the spacers 14 and the conductive layer 4. It will also be appreciated that both the conductive layer 4 and the conductive layer 8 may be partitioned to facilitate selective addressing of different portions of the conductive layer 8 through the vias 17 and the spacers 14.

What is claimed is:

1. A light-emitting device comprising:

a first component having a first substrate, a first electrode on said first substrate, an organic layer on said first electrode, and a light-transmissive second electrode on said organic layer;

a second component having a light-transmissive second substrate and a light transmissive, electrically conductive layer on said second substrate;

means for joining said first component and said second component with said second electrode of said first component facing said conductive layer of said second component;

an electrical contact for electrically connecting said second electrode of said first component and said conductive layer of aid second component; and a spacer between said first component and said second component, wherein said spacer is integral to said first component, disposed on said first substrate, and coated with said organic layer.

2. A device as claimed in claim 1, wherein said spacer is covered by said second electrode.

3. A device as claimed in claim 1, wherein said spacer is integral to said second component.

4. A device as claimed in claim 1, wherein said spacer is electrically conductive.

5. A device as claimed in claim 1, wherein said first component comprises a plurality of organic layers disposed between said first electrode and said second electrode.

6. A device as claimed in claim 1, wherein said spacer is located at a site remote from areas of said substrate occupied by said first electrode.

7. A device as claimed in claim 1, wherein said joining means comprises a peripheral seal between said first component and said second component and a vacuum is disposed within said peripheral seal.

* * * * *